United States Patent
Trevisan et al.

(12)

(10) Patent No.: US 6,310,486 B1
(45) Date of Patent: *Oct. 30, 2001

(54) INTEGRATED TEST CELL

(75) Inventors: David Trevisan, San Jose; Michael A. Caradonna, Los Altos; Paul Trudeau, Sunnyvale; Isreal Blagdan, San Jose; A. E. LeColst, Moorpark, all of CA (US)

(73) Assignee: Teradyne, Inc., Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/410,857

(22) Filed: Oct. 1, 1999

(51) Int. Cl.⁷ .................................................. G01R 31/26
(52) U.S. Cl. ...................... 324/765; 324/158.1; 324/754; 414/226.1; 414/225
(58) Field of Search .................... 324/158.1, 758, 324/754, 765; 74/490.7; 73/865.9, 866.5; 414/226.1, 225; 209/573

(56) References Cited

U.S. PATENT DOCUMENTS

| | | | |
|---|---|---|---|
| 4,760,924 | * 8/1988 | Sato et al. ............................ | 209/573 |
| 4,926,118 | * 5/1990 | O Connor et al. ................ | 324/158.1 |
| 4,936,329 | * 6/1990 | Michael et al. ...................... | 414/225 |
| 5,126,656 | 6/1992 | Jones . | |
| 5,164,661 | 11/1992 | Jones . | |
| 5,307,011 | * 4/1994 | Tani ................................... | 324/158.1 |
| 5,315,240 | 5/1994 | Jones . | |
| 5,384,531 | * 1/1995 | Yamazaki et al. .................... | 324/765 |
| 5,420,521 | 5/1995 | Jones . | |
| 5,450,766 | 9/1995 | Holt . | |
| 5,461,920 | 10/1995 | Prause et al. . | |
| 5,506,512 | * 4/1996 | Tozawa et al. ...................... | 324/754 |
| 5,606,262 | 2/1997 | Montalbano et al. . | |
| 5,654,631 | 8/1997 | Ames ................................. | 324/158.1 |
| 5,818,219 | 10/1998 | Hama et al. . | |
| 5,821,764 | 10/1998 | Slocum et al. . | |
| 5,900,737 | 5/1999 | Graham et al. ..................... | 324/758 |
| 5,931,048 | * 8/1999 | Slocum et al. .................... | 74/490.07 |
| 6,023,173 | * 2/2000 | Khater et al. ....................... | 324/758 |
| 6,024,526 | * 2/2000 | Slocum et al. .................... | 414/226.1 |
| 6,031,387 | * 2/2000 | Berar ................................... | 324/765 |

FOREIGN PATENT DOCUMENTS

WO 9924838
A    8/1997   (WO) ............................ G01R/1/04

* cited by examiner

Primary Examiner—Safet Metjahic
Assistant Examiner—Jimmy Nguyen
(74) Attorney, Agent, or Firm—Lance Kreisman

(57) ABSTRACT

A semiconductor tester is disclosed that is adapted for testing semiconductor devices disposed on a handling apparatus. The semiconductor tester includes a tester housing defining a self-supporting frame and formed with an externally accessible opening adapted for receiving the handling apparatus. A test controller is disposed within the housing and carried by the frame. Pin electronics including tester circuitry are responsive to the test controller and proximately coupled thereto and mounted to the frame. A docking apparatus is disposed above the opening and is adapted to couple the tester circuitry to the handling apparatus.

13 Claims, 5 Drawing Sheets

INTEGRATED TEST CELL

FIELD OF THE INVENTION

The invention relates generally to automatic test equipment for testing semiconductor devices, and more particularly an integrated automatic test system having a substantially reduced footprint for testing semiconductor devices.

BACKGROUND OF THE INVENTION

Manufacturers of semiconductor devices routinely test their products at the wafer and packaged-device levels. The testing is usually carried out by a sophisticated system commonly referred to as automatic test equipment. The equipment generally drives waveforms to and detects outputs from one or more devices-under-test (DUT). The detected outputs are then compared to expected values to determine whether the device functioned properly.

A critical concern for semiconductor manufacturers is how to maximize use of the limited floor space available for test. Typically, stringent cleanliness requirements are imposed while testing semiconductor devices to minimize the possibility of failures due to dust or debris. To meet such requirements, the automatic test equipment resides in sophisticated clean rooms that minimize the size and number of particles according to particular applications. Because of the cost necessary to operate and maintain clean rooms, maximizing clean room floor space is essential to minimizing manufacturing costs.

One type of conventional semiconductor tester generally includes a mainframe computer, or test controller, and a testhead coupled to the controller via a relatively large cable bundle. The testhead typically weighs several hundred pounds and houses a plurality of channel cards that include complex circuitry for coupling to the semiconductor devices-under-test (DUTs). The testhead is fixed to a manipulator that moves and adjusts the testhead into a variety of positions as needed.

Efficient semiconductor device testing generally requires an apparatus to move and quickly connect the device-under-test (DUT) to the tester. To move wafers, a machine called a prober is employed. To manipulate packaged-parts, a device called a handler is used. These units precisely position the semiconductor devices so that they make contact with the outputs of the tester. Probers, handlers and other devices for positioning a DUT relative to the testhead are called generically "handling apparatus."

While the conventional tester described above appears beneficial for its intended applications, the necessity of a complex and automated manipulator to move and align the testhead in place adds undesirable expense to the tester system. Manipulators often cost upwards of a few hundred thousand dollars. Additionally, and even more importantly, the separate nature of the testhead combined with the floor space required for the manipulator adds up to a relatively large footprint. This undesirably reduces the number of testers capable of operating in a given clean room, reducing device throughput and increasing unit costs overall.

In an effort to address the tester footprint issue, one proposal for a semiconductor tester positions a mainframe/ testbead unit vertically on top of a prober or handler. An example of this type of tester is found in the Teradyne Model J750 Tester, manufactured by Teradyne Inc., Boston, Mass. This construction dramatically reduces the tester footprint by making advantageous use of the vertical dimensions of the clean room. As a result, more testers are able to fit within a given horizontal clean room space.

Although the vertical configuration described above presents substantial footprint reduction benefits, the prober or handler generally supports the mainframe/testhead unit. As a result, a manipulator is still often required for servicing purposes, such as the initial installation of the unit or temporary removal of the mainframe/testhead unit from the handler or prober. Consequently, in order to plan for occasional servicing, space often must be made available in the clean room for the ingress and egress of the manipulator. The space set aside thus displaces potential floor room area for more testers and greater throughput.

What is needed and heretofore unavailable is a semiconductor test system that incorporates a minimal footprint and requires no manipulator for servicing. The integrated test cell of the present invention satisfies these needs.

SUMMARY OF THE INVENTION

The integrated test cell of the present invention provides the capability of servicing a semiconductor tester without undocking from a handling device such as a prober or handler. As a result, the use of a manipulator is unnecessary, thereby dramatically reducing costs. This also contributes to a significant reduction in the mean-time-to-repair (MTTR) parameter of the tester. Moreover, the vertical nature of the test cell presents a substantially reduced footprint, enabling the maximization of available clean room floor space.

To realize the foregoing advantages, the invention in one form comprises a semiconductor tester that is adapted for testing semiconductor devices disposed on a handling apparatus. The semiconductor tester includes a tester housing defining a self-supporting frame and formed with an externally accessible opening adapted for receiving the handling apparatus. A test controller is disposed within the housing and carried by the frame. Pin electronics including tester circuitry are responsive to the test controller and proximately coupled thereto and mounted to the frame. A docking apparatus is disposed above the opening and is adapted to couple the tester circuitry to the handling apparatus.

In another form, the invention comprises an integrated test cell for testing semiconductor devices. The integrated test cell includes a handling apparatus adapted for securing the semiconductor devices into testable positions and a tester housing defining a self-supporting frame. The frame is formed with an externally accessible opening adapted for receiving the handling apparatus. A test controller is disposed within the housing and carried by the frame. Pin electronics including tester circuitry are responsive to the test controller and proximately coupled to the test controller and mounted to the frame. A docking apparatus is disposed above the opening and is adapted to couple the tester circuitry to the handling apparatus.

In a further form, the invention comprises a cart apparatus for engaging a handling apparatus in an integrated test cell and providing selective ingress and egress of the handling apparatus to and from the test cell. The cart apparatus includes respective fore and aft channel supports disposed in parallel relationship and a pair of lateral side beams fixed to the respective ends of the fore and aft channel supports. The side beams cooperate with to channel supports to form a rectangular platform. The cart apparatus further includes a vertically upstanding handle fixed to the fore channel support and a plurality of casters disposed beneath the platform to provide selective mobility for the cart.

In yet another form, the invention comprises a method of coupling a semiconductor tester with a handling apparatus. The method includes the steps of providing an opening within the tester for receiving the handling apparatus; sliding the handling apparatus into the opening; and docking the tester to the handling apparatus.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
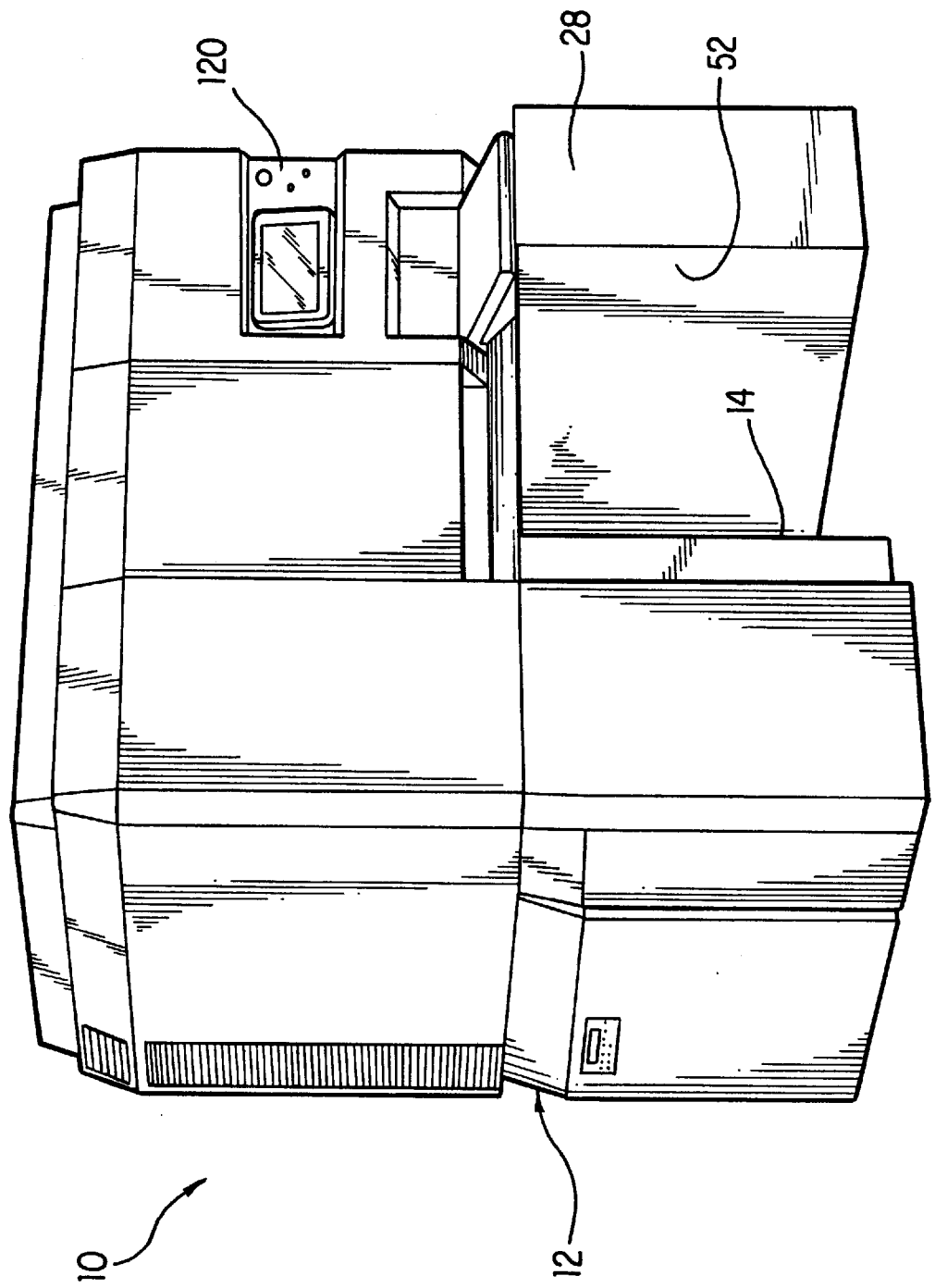
FIG. 1 is a front prospective view of a semiconductor tester according to one embodiment of the present invention.
Figure 4:
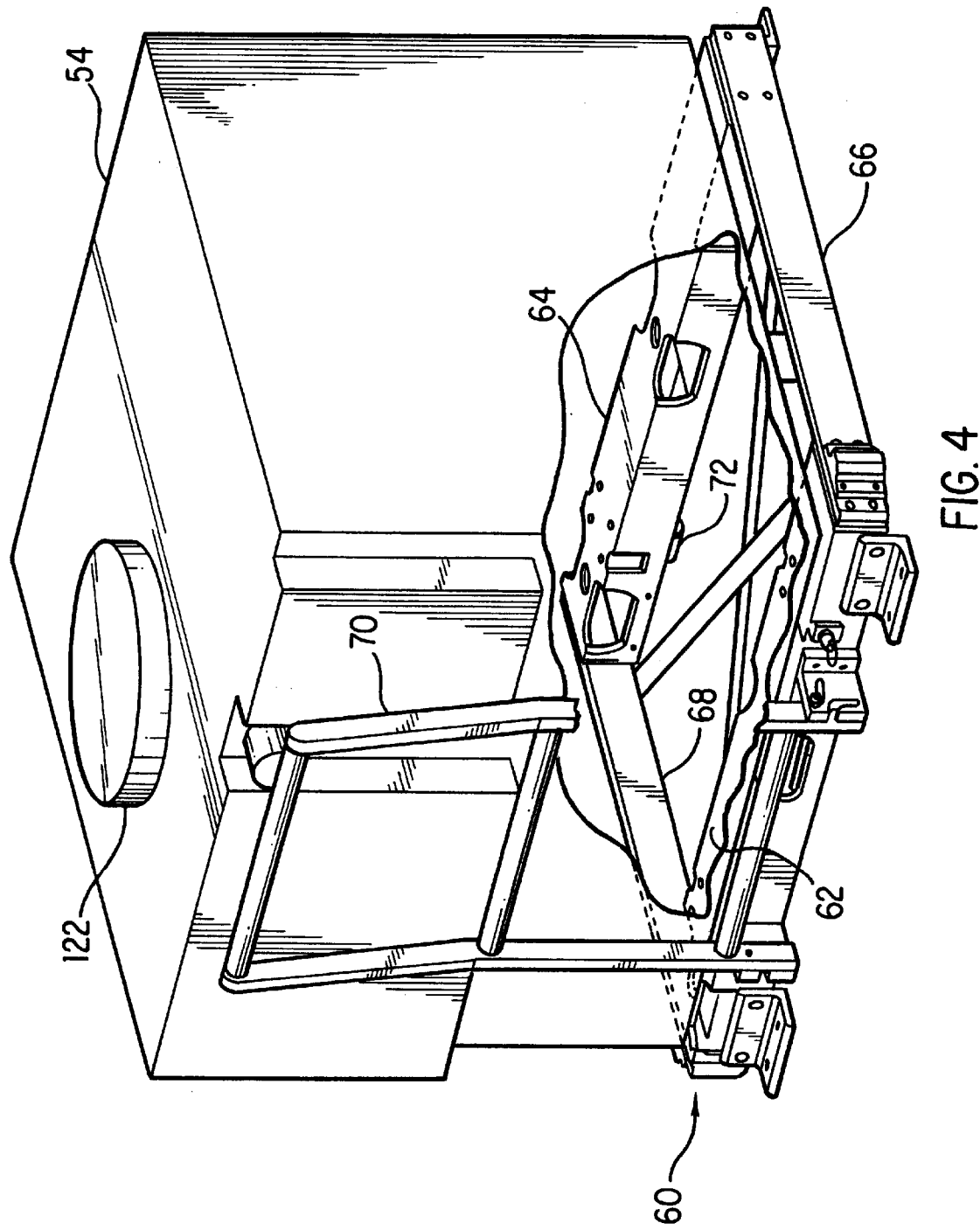
FIG. 4 is a partial view of a handling apparatus carried by the cart apparatus of the present invention.
Figure 5:
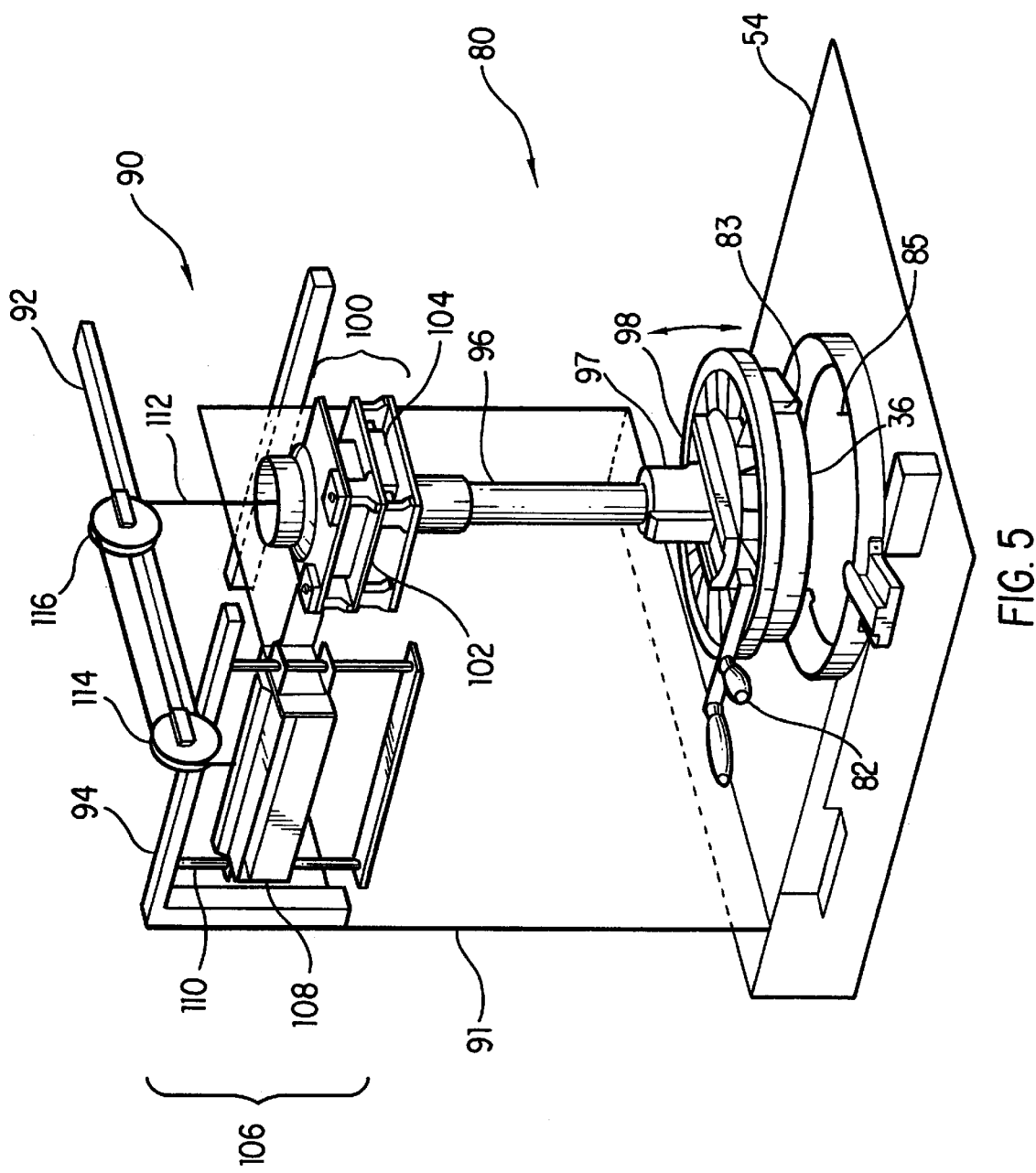
FIG. 5 is a perspective view of an interface apparatus for use inside the tester of FIG. 1.

Referring now to FIG. 1, a semiconductor tester according to one embodiment of the present invention and generally designated 10, provides substantial advantages in manufacturing efficiency by minimizing the tester footprint associated with the horizontal dimensions of the tester system. The footprint is minimized by utilizing a self-supporting frame 12 formed with an opening 52 adapted to slidably receive a handling apparatus 54 (FIG. 4). Pin electronics 39 (FIG. 2) are mounted in the flame along with a docking apparatus 80 (FIG. 5). The docking apparatus provides convenient serviceability of the docked handling apparatus without the use of a manipulator, thereby allowing relatively high tester system density within a given cleanroom, and correspondingly reducing manufacturing costs.

Figure 2:
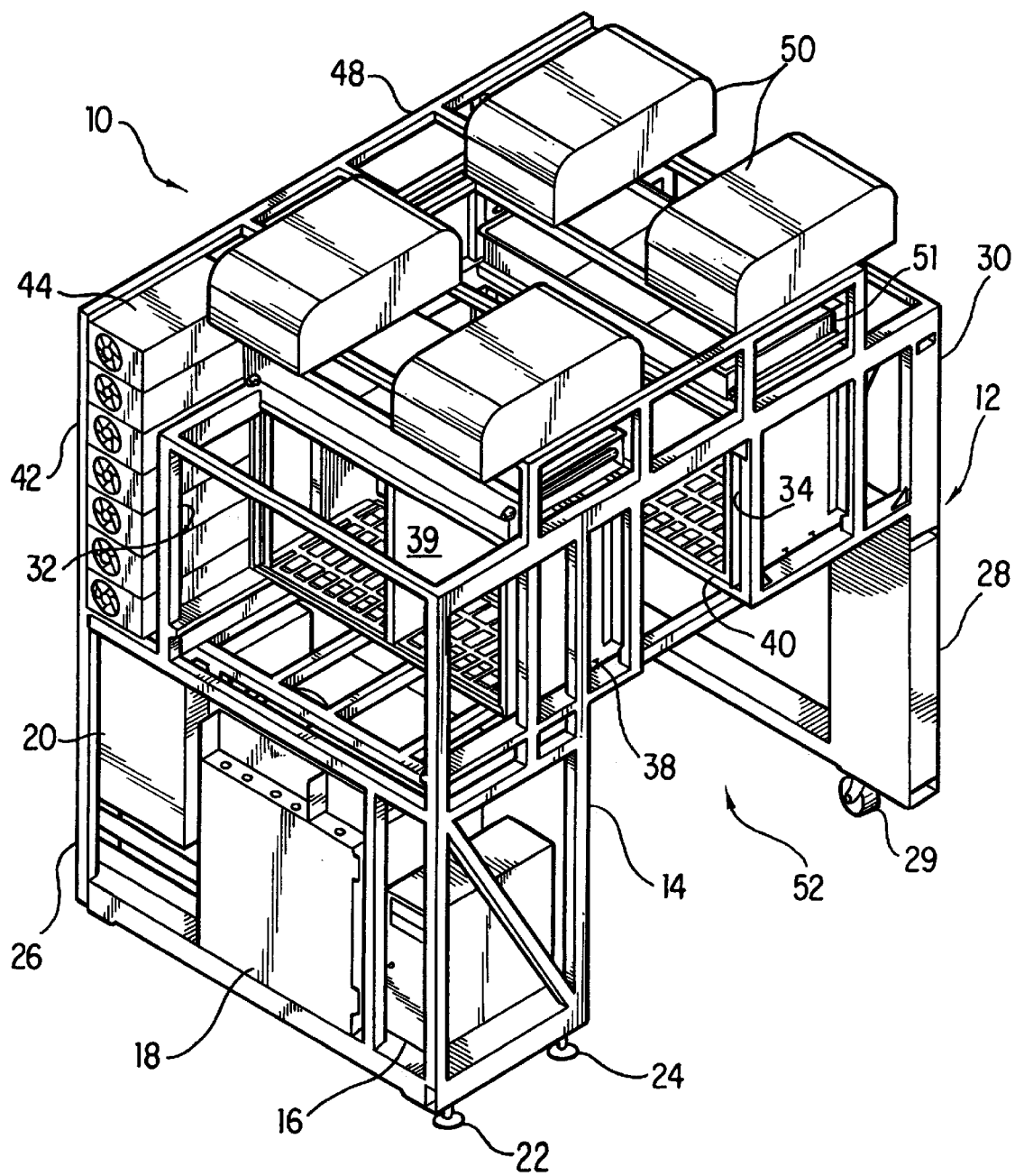
FIG. 2 is an elevated perspective view of the semiconductor tester of FIG. 1 with the external panels removed for clarity.
Figure 3:
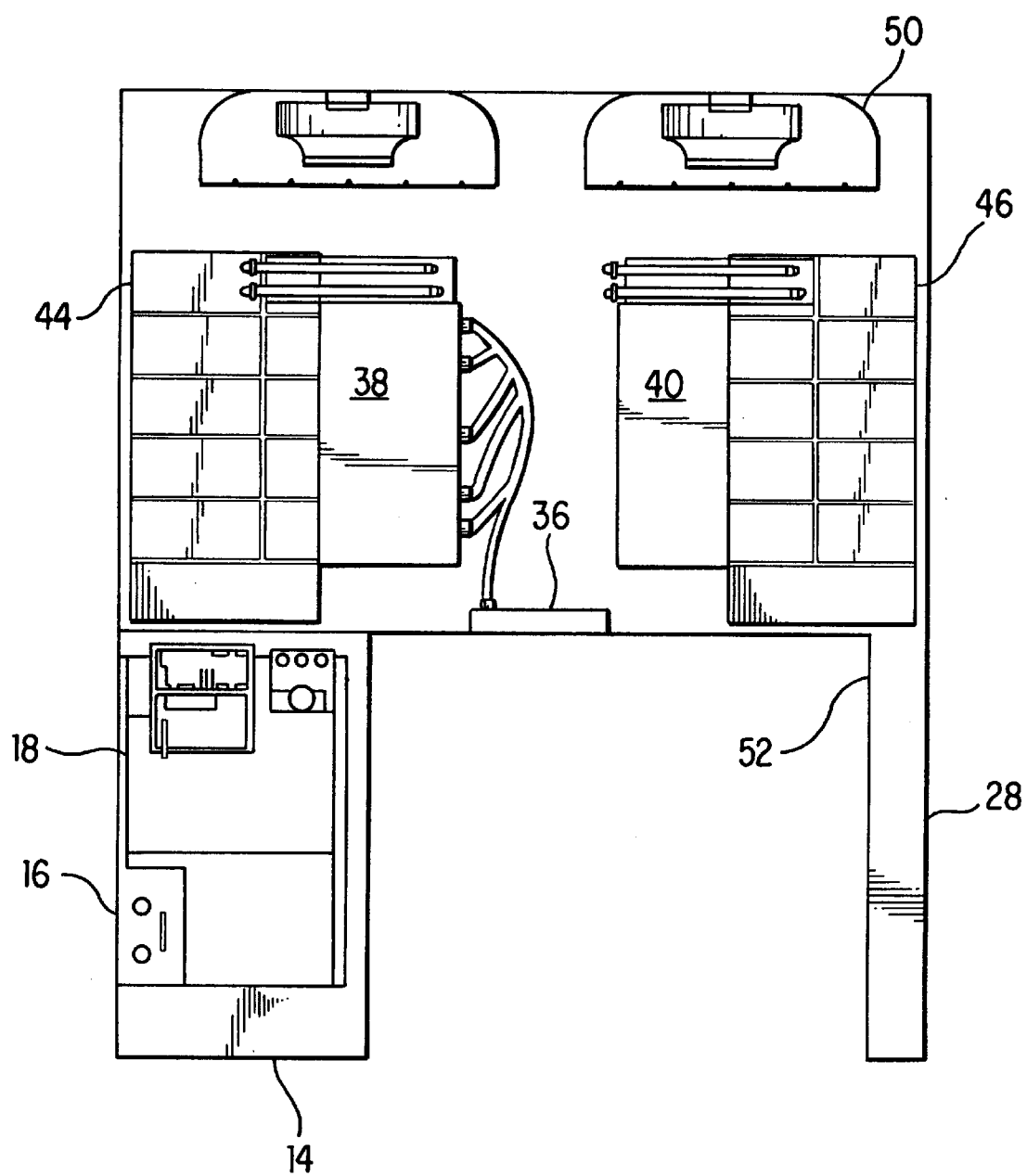
FIG. 3 is a partial front plan view of the semiconductor tester of FIG. 2.

With reference now to FIGS. 2 and 3, the frame 12 is formed with respective oppositely disposed first and second base support structures 14 and 28 for carrying an electronics platform 30. The entire frame structure is constructed of steel and projects vertically to define a relatively small horizontal footprint. The first base support 14 is formed with an upstanding rectangular cross-section and includes a plurality of open compartments for mounting a central processing unit (CPU) 16, a cooling distribution unit (CDU) 18, and a power distribution unit (PDU) 20. A pair of spaced apart levelers 22 and 24 provide an adjustable leveling capability at the fore section of the first base support while the aft portion includes a convenient water and power access port 26. The second base support 28 projects vertically in substantially parallel relationship with the first support. Formed relatively narrow in rectangular cross-section, the second base support includes at its lower extremity a pair of oppositely disposed casters 29 (only one caster shown).

Further referring to FIGS. 2 and 3, the electronics platform 30 is formed integral with the base supports 14 and 28 and is disposed horizontally thereacross. The platform includes a network of welded bars cooperating to form a lateral rectangular structure and defining respective first and second cavities 32 and 34. The cavities are positioned above and on opposing sides of a circular-shaped probe ring 36 (FIG. 3) and adapted for mounting respective first and second cardcage assemblies 38 and 40. The card cages house the tester pin electronics 39 for testing semiconductor devices (not shown). The platform includes an aft section formed with a vertically extending rack framework 42 for nesting respective stacks of power supplies 44 and 46 (FIG. 3).

Further referring to FIG. 2, disposed above the respective card cages 38 and 40 is a cooling system support structure 48 formed to carry a plurality of fans 50 and heat exchangers 51. The fans and heat exchangers form a portion of a sealed cooling system more fully described in pending U.S. patent application Ser. No. 09/360180, entitled Semiconductor Tester Cooling System", filed Jul. 23, 1999, assigned to the assignee of the present invention, and hereby expressly incorporated herein by reference. The first and second base supports 14 and 28 and the electronics platform 30 collectively form a laterally accessible opening 52 adapted to slidably receive the handling apparatus 54 (FIG. 4).

Referring more particularly to FIG. 4, in order to access the opening 52, the handling apparatus 54 is preferably slidably carried by a mobile cart apparatus 60. The cart apparatus includes respective fore and aft steel channel supports 62 and 64 disposed in parallel relationship and bounded laterally by a pair of side beams 66 and 68 fixed thereto. The side beams and channel supports cooperate to form a rectangular platform. A vertically upstanding steel handle 70 is mounted to the fore channel support 62 for effecting maneuverability of the prober/cart assembly with a push/pull force of around twenty-five pounds. A plurality of locking casters 72 provide the necessary selective mobility. Conveniently positioned visual indicators (not shown) cooperate with a feedback mechanism (not shown) for providing a coarse alignment capability for the operator as the unit installs within the frame opening 52.

Referring now to FIG. 5, the docking apparatus 80 is conveniently adapted to align and dock the semiconductor tester 10 to the handling apparatus (not shown). The docking apparatus includes the probe ring assembly 36 and a self-alignment mechanism 90 for enabling precise manual alignment of the probe ring with the handling apparatus (not shown) by a single operator.

The probe ring assembly 36 is formed in a circular shape with modular compartments or cavities (not shown) to provide high density routing of signal channels between the pin electronics of the tester 10 and a parallel array of devices-under-test (not shown) disposed on a prober-supported wafer (not shown). A radially projecting handle 82 and a plurality of cam grooves 83 are disposed at the periphery of the ring. The probe ring and associated routing circuitry for coupling the pin electronics 39 to the handling apparatus 54 are more fully described in copending U.S. patent application Ser. No. 09/340,832, entitled "Semiconductor Parallel Tester", filed Jun. 28, 1999, assigned to the assignee of the present invention, and hereby expressly incorporated herein by reference.

The self-alignment mechanism 90 is carried by respective lateral and longitudinal support members 92 and 94 welded to the frame 12 in close proximity to one of the card cage backplane assemblies 91. The alignment mechanism couples to the probe ring 36 through a vertically extending arm that serves as a compression bar 96 during operation. The arm is secured to the probe ring by a connector 97 that couples to a pivot 98. A dual-axis table 100 is mounted atop the extension arm and comprises respective linear bearings 102 and 104 for horizontally directing the probe ring along the X and Y axes. A counterweight assembly 106 couples to the compression bar and includes a counterweight 108 slidable along a guide rail 110 and tethered to the extension arm via a cable 112 that traverses a pair of in-line pulleys 114 and 118 for effecting vertical displacement of the probe ring.

For prober applications, a preferred handling apparatus is the TEL P8XL Prober, manufactured by Tokyo Electronics, Ltd., of Tokyo, Japan. The prober includes a base ring 37 that is formed with a plurality of cam followers 85 for engaging the cam grooves 83. Also provided is an automatic probe card changer (not shown) for compressing the probe ring pogo pins (not shown). This machine is known to have a high z-force chuck that can serve a 32-site, high pin count application. Optionally, the prober may share an operator interface 120 (FIG. 1) with the tester 10 to advantageously minimize the number of monitor displays and keyboards for the system operator.

In situations involving packaged-device testing, a preferred handling apparatus comprises the Galileo model Handler, manufactured by Kinetrix, Inc., of Bedford, N.H. The handler manipulates standard JEDEC device trays and provides DUT hot and cold soak capability. Additionally, the handler is optimized for moving DUTs in and out of contactor sockets, providing very low jam rates and high throughput.

The initial set-up of the test system involves installing the prober 54 within the frame opening 52 by engaging the prober with the service cart 60. This involves first positioning the cart beneath the prober such that the prober leveling feet are carried by the channel supports 62 and 64. The prober is then slid into the frame opening 52 and leveled. Once the prober is coarsely aligned within the opening with respect to the probe ring, the operator can commence the following docking steps to hard-dock the docking apparatus to the prober.

Referring now to FIG. 5, the operator initiates docking by manually lowering the probe ring 36 onto the base ring 37. The probe ring is able to move fore, aft, and laterally due to the X-Y table 100 at the point of connection to the tester mainframe. This allows for minor misalignments between the prober and tester. The probe ring is able to easily move up and down due to the pulleyed counterweight 100.

The operator then visually aligns the probe ring such that it enters the inner diameter of the base ring and the cam followers 85 engage the cam grooves 83. Once this has occurred, the operator can engage a cam lock by turning the handle approximately 22 degrees counterclockwise. At this point, docking is complete and the operator can initiate the automatic probe card changer (not shown) to compress the pogo pins. The electrical connection between the prober and the tester is then complete.

Following the docking procedure above, and calibration procedures well known to those skilled in the art, one or more semiconductor devices at the wafer level are then tested. This usually involves the application and capture of tester waveforms to and from the device(s) according to processes well known to those skilled in the art.

At some point, the handling apparatus 54 and/or tester 10 may require servicing to, for example access the prober head plate 122 (FIG. 4) for preventive maintenance. Because of the self-supporting nature of the tester frame, no manipulator is required to assist in the undocking procedure to effect the servicing. Rather, an operator merely decouples the probe ring from the prober by releasing the fasteners, and lifting the probe ring via the probe ring handle.

Those skilled in the art will appreciate the many benefits and advantages afforded by the present invention. Of significant importance is the dramatically reduced tester footprint that allows semiconductor manufacturers to maximize the use of clean room space. By maximizing clean room utilization, more testers may be employed to improve device throughput and reduce costs. Additionally, because of the self-supporting nature of the integrated test cell, servicing of the tester does not require the use of a costly and bulky manipulator. While this feature reduces component costs, the mean time for repair is also substantially reduced because of the straightforward docking capability, thereby maximizing tester throughput.

While the invention has been particularly shown and described with reference to the preferred embodiments thereof, it will be understood by those skilled in the art that various changes in form and detail may be made therein without departing from the spirit and scope of the invention.

What is claimed is:

1. A semiconductor tester adapted for testing semiconductor devices disposed on a handling apparatus, said semiconductor tester including:

a tester housing adapted for resting on a floor and comprising a manipulator-less self-supporting frame and formed with an externally accessible opening, said opening adapted for receiving said handling apparatus;

a test controller disposed within said housing and carried by said frame;

pin electronics including tester circuitry responsive to said test controller and proximately coupled to said test controller and mounted to said manipulator-less self-supporting frame; and a docking apparatus disposed above said opening and adapted to couple said tester circuitry to said handling apparatus.

2. A semiconductor tester for use with a manipulator-less test system according to claim 1 wherein said docking apparatus includes a probe ring assembly adapted to engage said handling apparatus.

3. A semiconductor tester for use with a manipulator-less test system according to claim 1 wherein said probe ring assembly includes a self-alignment mechanism for aligning said probe ring with said handling apparatus.

4. A semiconductor tester for use with a manipulator-less test system according to claim 1 wherein said self-alignment mechanism includes:

a multi-axis table;

a vertically extending compression bar fixed to said multi-axis table and fastened to said probe ring via a pivot disposed on said ring; and a handle mounted to said probe ring for manually pivoting said probe ring about said pivot.

5. A semiconductor tester for use with a manipulator-less test system according to claim 1 wherein:

said frame defines a plurality of card-cage modules; and said pin electronics comprise a plurality of channel cards disposed in spaced-apart relationship in said card-cage modules.

6. A semiconductor tester for use with a manipulator-less test system according to claim 5 wherein:

said frame includes respective first and second base supports, and said opening is formed intermediate said base supports; and said card-cage modules comprise a pair of card-cages set in opposing spaced-apart relationship above said opening.

7. Automatic test equipment for testing semiconductor devices, said automatic test equipment including:

a handling apparatus adapted for securing said semiconductor devices into testable positions;

a tester housing adapted for resting on a floor and comprising a manipulator-less self-supporting frame and formed with an externally accessible opening, said opening adapted for receiving said handling apparatus;

a test controller disposed within said housing and carried by said fame;

pin electronics including tester circuitry responsive to said test controller and proximately coupled to said test controller and mounted to said manipulator-less self-supporting fame; and a docking apparatus disposed above said opening and adapted to couple said tester circuitry to said handling apparatus.

8. A manipulator-less test system according to claim 7 wherein said handling apparatus comprises a prober.

9. A manipulator-less test system according to claim 7 wherein said handling apparatus comprises a handler.

10. A manipulator-less test system according to claim 7 and further including:

a cart apparatus adapted to engage said handling apparatus and provide selective slidable ingress and egress of said handling apparatus to and from said opening.

11. A manipulator-less test system according to claim 10 wherein said cart apparatus includes:

respective fore and aft channel supports disposed in parallel relationship;

a pair of lateral side beams fixed to the respective ends of said fore and aft channel supports and cooperating therewith to form a rectangular platform;

a vertically upstanding handle fixed to said fore channel support; and a plurality of casters disposed beneath said platform to provide selective mobility for said cart.

12. A manipulator-less test system according to claim 11 wherein said casters are configured to effect maneuverability of said cart with a push/pull force of no greater than around twenty-five pounds.

13. A manipulator-less test system according to claim 12 wherein said cart apparatus includes a coarse alignment mechanism or coarsely positioning said handling apparatus within said frame opening.

\* \* \* \* \*